United States Patent
Hosotani et al.

(10) Patent No.: US 10,410,704 B2
(45) Date of Patent: Sep. 10, 2019

(54) MEMORY DEVICE

(71) Applicant: TOSHIBA MEMORY CORPORATION, Minato-ku, Tokyo (JP)

(72) Inventors: Keiji Hosotani, Yokkaichi Mie (JP); Tatsuya Kishi, Seongnam-si Gyeonggi-do (KR); Akira Katayama, Yokohama Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/702,430

(22) Filed: Sep. 12, 2017

(65) Prior Publication Data

US 2018/0277183 A1    Sep. 27, 2018

(30) Foreign Application Priority Data

Mar. 23, 2017    (JP) ................................. 2017-058171

(51) Int. Cl.

| G11C 11/16 | (2006.01) |
|---|---|
| H01L 27/22 | (2006.01) |
| H01L 43/08 | (2006.01) |
| H01L 43/10 | (2006.01) |

(52) U.S. Cl.
CPC .......... *G11C 11/161* (2013.01); *H01L 27/228* (2013.01); *H01L 43/08* (2013.01); *H01L 43/10* (2013.01); *G11C 11/1673* (2013.01)

(58) Field of Classification Search
CPC . G11C 11/161; G11C 11/1673; H01L 27/228; H01L 43/08; H01L 43/10
See application file for complete search history.

(56) References Cited

U.S. PATENT DOCUMENTS

| 6,707,710 | B1 * | 3/2004 | Holden | ................... | G11C 11/16 |
|---|---|---|---|---|---|
| | | | | | 365/158 |
| 8,093,668 | B2 * | 1/2012 | Ueda | ..................... | H01L 27/228 |
| | | | | | 257/108 |
| 8,213,213 | B2 | 7/2012 | Chang et al. | | |
| 8,576,617 | B2 * | 11/2013 | Zhu | ......................... | G11C 11/16 |
| | | | | | 365/158 |
| 2003/0031045 | A1 | 2/2003 | Hosotani | | |
| 2003/0223268 | A1 | 12/2003 | Tanizaki et al. | | |

(Continued)

FOREIGN PATENT DOCUMENTS

| JP | 2003060165 A | 2/2003 |
|---|---|---|
| JP | 2004005797 A | 1/2004 |

*Primary Examiner* — Tri M Hoang
(74) *Attorney, Agent, or Firm* — Holtz, Holtz & Volek PC

(57) ABSTRACT

According to one embodiment, a memory includes a first MTJ element having a first area along a first plane; and second MTJ elements each having a second area along the first plane. The second area is larger than or equal to twice the first area and smaller than or equal to five times the first area. Each of the second MTJ elements includes a first ferromagnet, a second ferromagnet, and a first nonmagnet. Respective magnetizations of respective first ferromagnets of the second MTJ elements are oriented along a first direction. Respective magnetizations of respective second ferromagnets of the second MTJ elements are oriented along a second direction. One of the second MTJ elements is coupled to another one of the second MTJ elements in series or in parallel.

16 Claims, 16 Drawing Sheets

(56) References Cited

U.S. PATENT DOCUMENTS

2008/0315335 A1* 12/2008 Ueda .................. G11C 11/16
                                                    257/421
2010/0232210 A1*  9/2010 Kajiyama ............ H01L 27/228
                                                    365/148
2018/0068702 A1*  3/2018 Jung .................. G11C 11/161

* cited by examiner

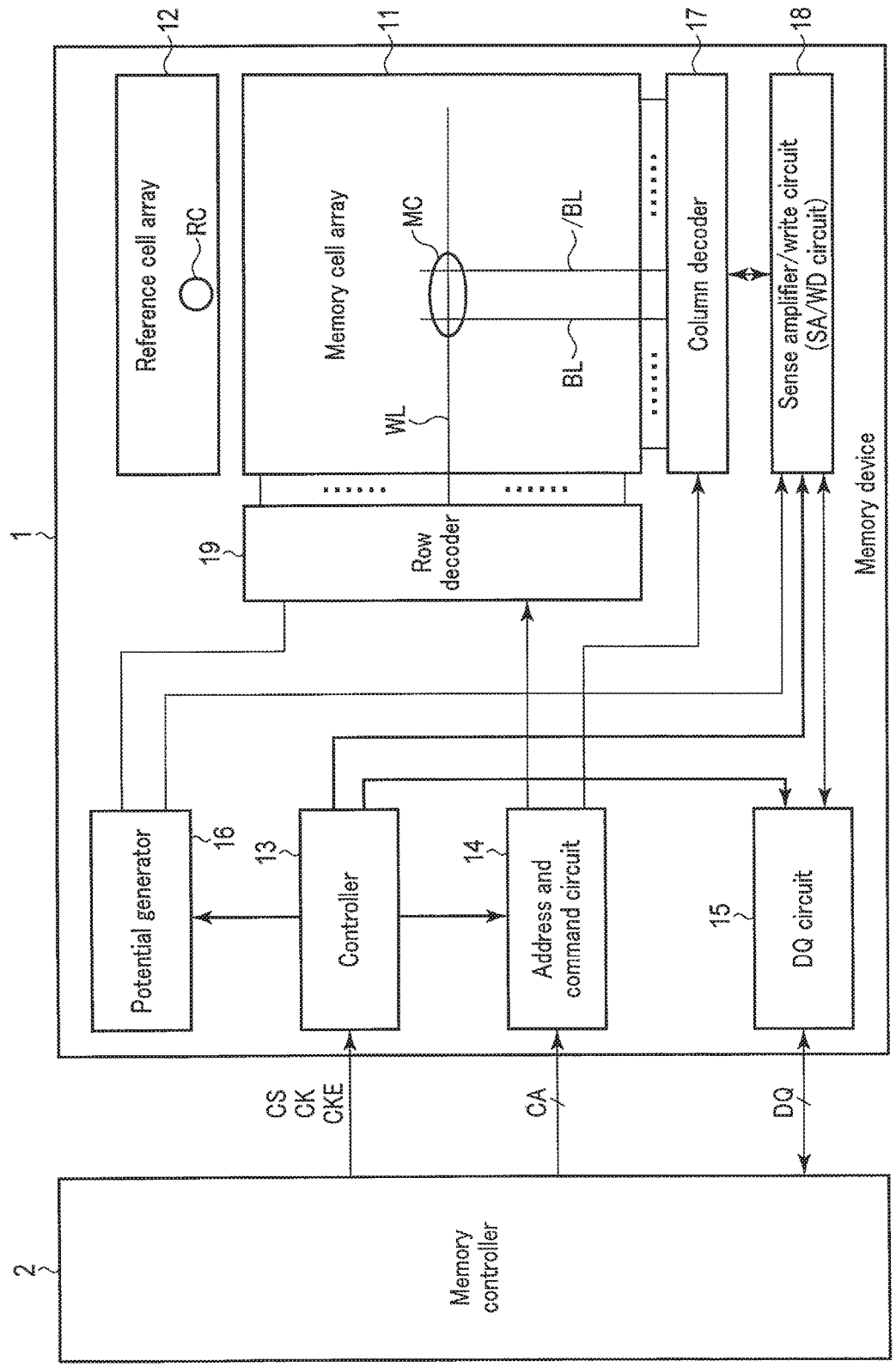
F I G. 1

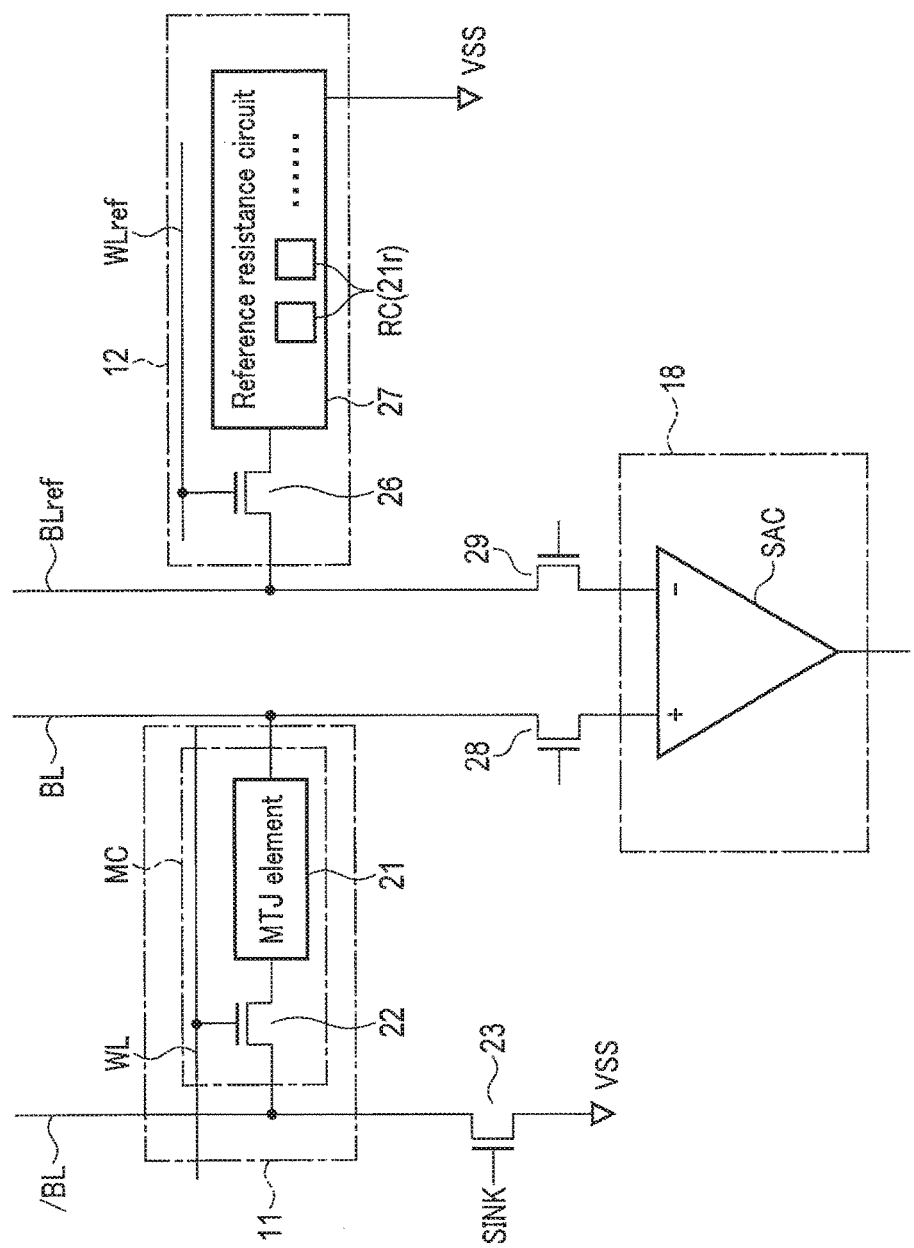
F I G. 2

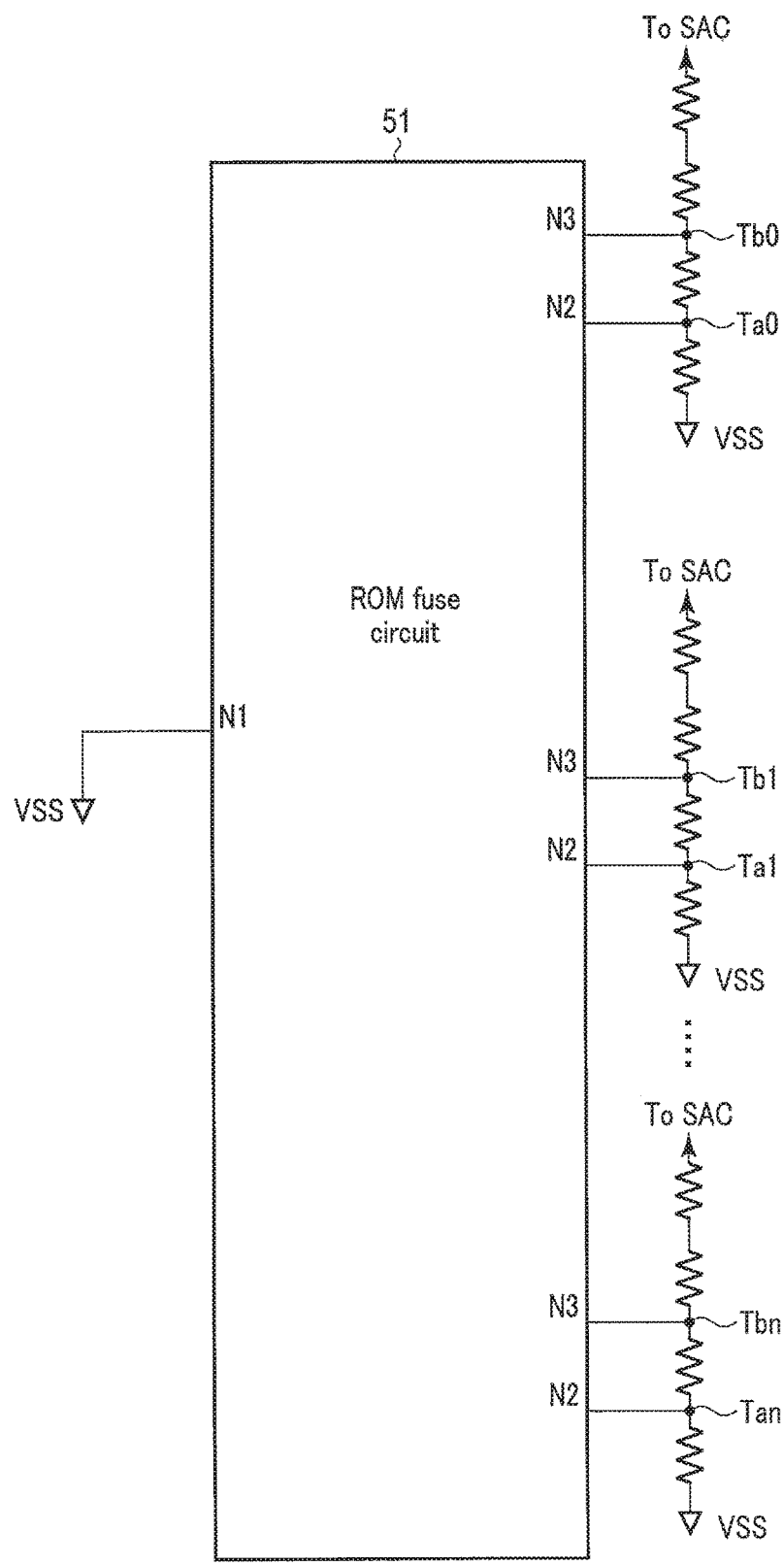
F I G. 10

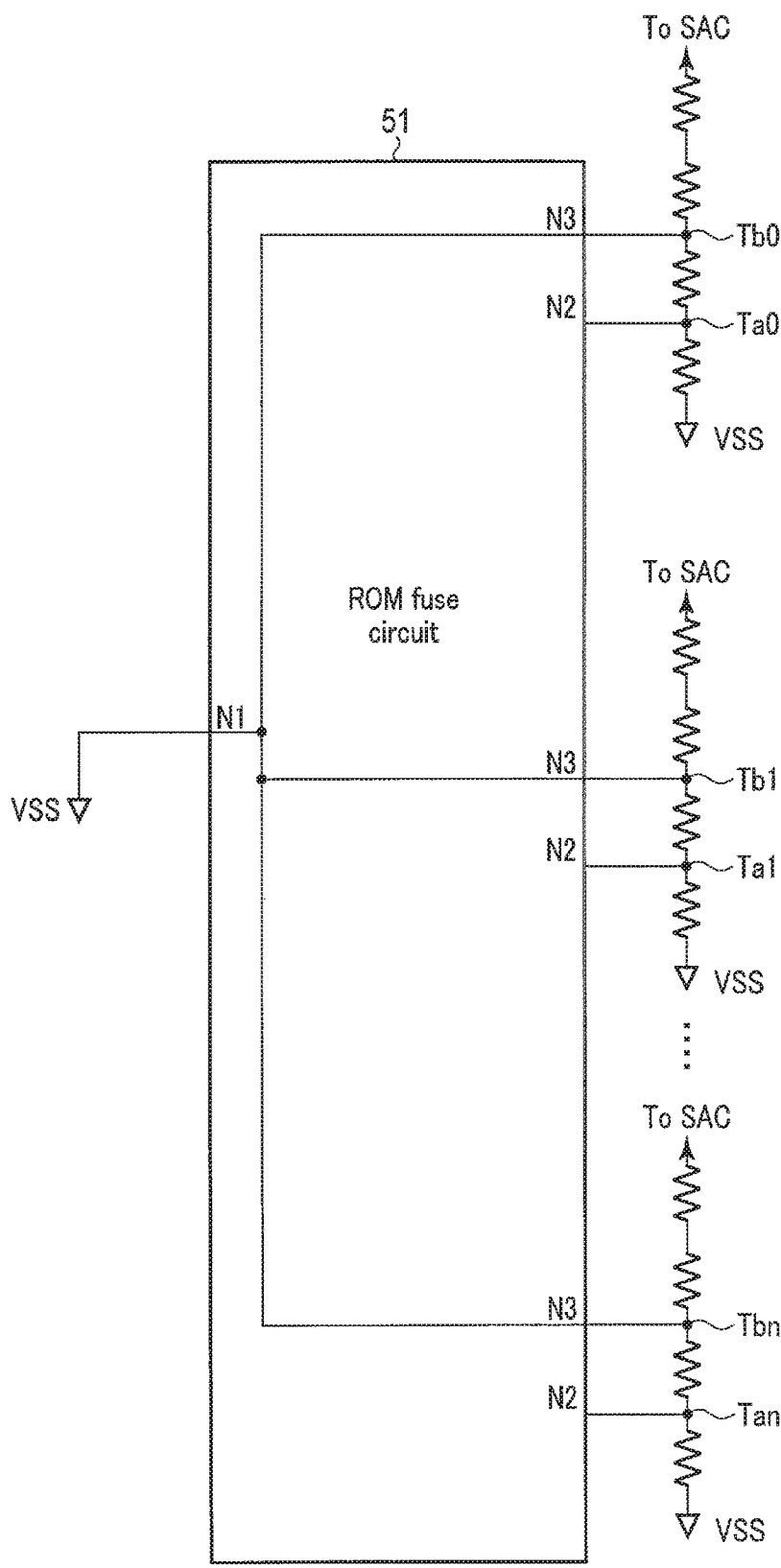
F I G. 11

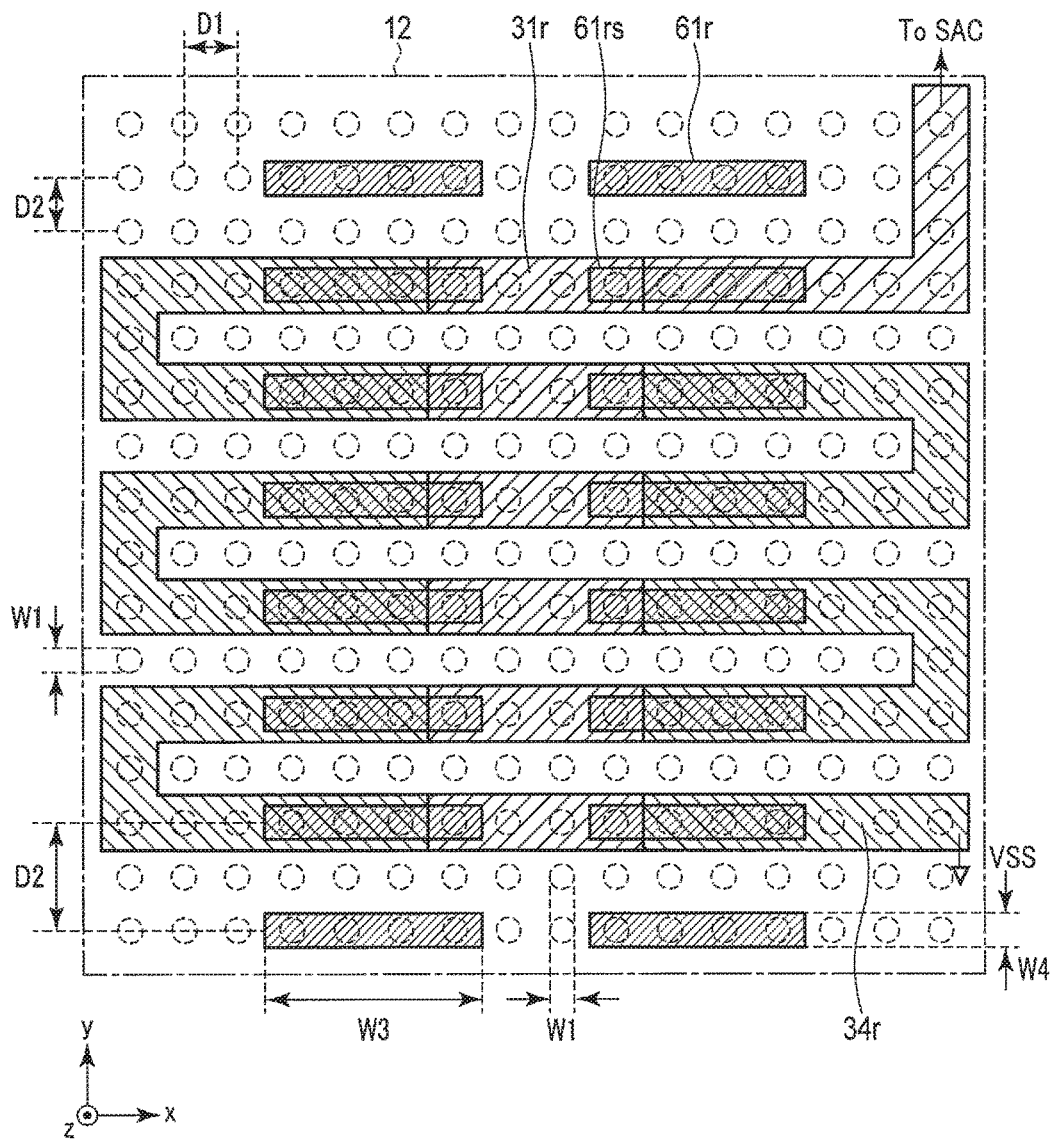
F I G. 15

MEMORY DEVICE

CROSS-REFERENCE TO RELATED APPLICATIONS

This application is based upon and claims the benefit of priority from Japanese Patent Application No. 2017-58171, filed Mar. 23, 2017, the entire contents of which are incorporated herein by reference.

FIELD

Embodiments described herein relate generally to a memory device.

BACKGROUND

Memory devices which store data using the magnetoresistive effect are known.

BRIEF DESCRIPTION OF THE DRAWINGS

FIG. 1 illustrates functional blocks of a memory device of a first embodiment;

FIG. 2 illustrates some components and connections of the memory device of the first embodiment;

FIG. 10 illustrates components and connections of a part of the memory device of the modification of the first embodiment;

FIG. 11 illustrates one state of the components of a part of the memory device of the modification of the first embodiment;

FIG. 15 illustrates a plan view of a part of a reference cell array of the third embodiment;

DETAILED DESCRIPTION

Figure 3:
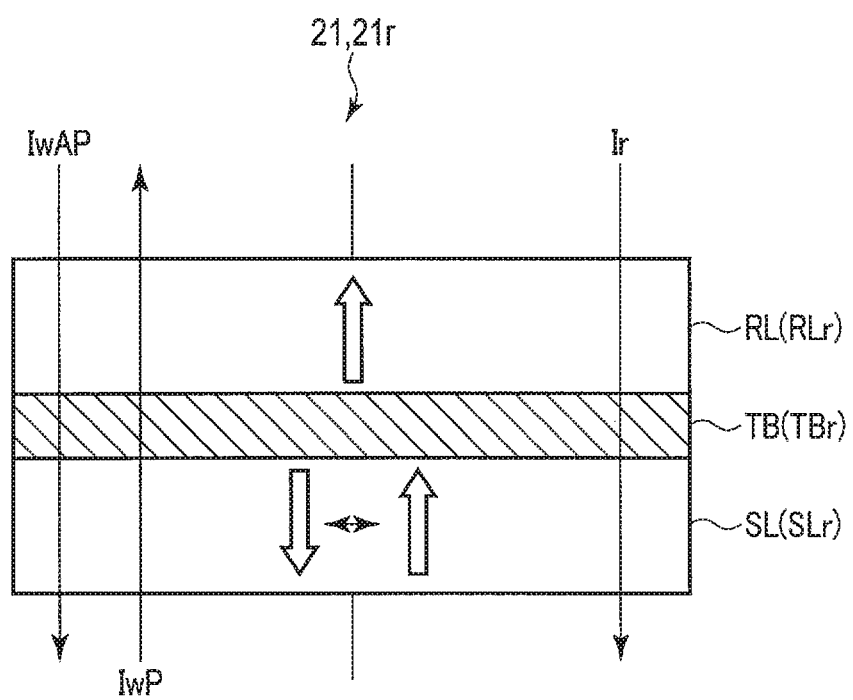
FIG. 3 illustrates a structure of an MTJ element of the first embodiment.

In general, according to one embodiment, a memory includes a first MTJ element having a first area along first plane; and second MTJ elements each having a second area along the first plane. The second area is larger than or equal to twice the first area and smaller than or equal to five times the first area. Each of the second MTJ elements includes a first ferromagnet, a second ferromagnet, and a first nonmagnet between the first and second ferromagnets. Respective magnetizations of respective first ferromagnets of the second MTJ elements are oriented along a first direction. Respective magnetizations of respective second ferromagnets of the second MTJ elements are oriented along a second direction. One of the second MTJ elements is coupled to another one of the second MTJ elements in series or in parallel.

Embodiments will now be described with reference to the figures. In the following description, components with substantially the same functionalities and configurations will be referred to with the same reference numerals, and repeated descriptions may be omitted. The figures are schematic, and the relations between the thickness and the area of a plane of a layer and ratios of thicknesses of layers may differ from actual ones. The figures may include components which differ in relations and/or ratios of dimensions in different figures. The entire description for a particular embodiment also applies to another embodiment unless it is explicitly mentioned otherwise or obviously eliminated.

Each functional block can be implemented as hardware, computer software, or combination of the both. For this reason, in order to clearly illustrate that each block can be any of hardware, computer software or combination, descriptions will be made in terms of their functionalities in general. It is not necessary that functional blocks are distinguished as in the following examples.

Any step in a flow of a method of an embodiment is not limited to any illustrated order, and can occur in an order different from an illustrated order and/or can occur concurrently with another step.

In the specification and the claims, a phrase of a particular first component being "coupled" to another second component includes the first component being coupled to the second component either directly or via one or more components which are always or selectively conductive.

First Embodiment

<1-1. Structure (Configuration)>

FIG. 1 illustrates functional blocks of a (magnetic) memory device of the first embodiment. As illustrated in FIG. 1, the memory device 1 is coupled to and controlled by the memory controller 2.

The memory device 1 includes components, such as a memory cell array 11, a reference cell array 12, controller 13, an address and command circuit 14, a DQ circuit 15, a potential generator 16, a column decoder 17, a sense amplifier/write circuit (SA/WD circuit) 18, and a row decoder 19.

The memory cell array 11 includes memory cells MC. The memory cells MC are arranged, for example in a form of a matrix. Each memory cell MC is coupled to a word line WL, and a pair of bit lines BL and /BL. The word lines WL are associated with rows and the bit line pairs are associated with columns. Each memory cell MC includes a magnetic tunnel junction (MTJ) element 21, which is not shown. Each of the MTJ elements 21 includes magnetic tunnel junctions, can take one of two switchable resistance states, exhibits the magnetoresistive effect, and can store data using the magnetoresistive effect.

The reference cell array 12 includes reference cells RC. Each reference cell RC also includes magnetic tunnel junctions, can take one of two switchable resistance states, exhibits the magnetoresistive effect, and can store data using the magnetoresitive effect.

The controller 13 receives various control signals from the memory controller 2. The control signals include a chip select signal CS, a clock signal CK, and a clock enable signal CKE, for example. The controller 13 uses the control signals to control the address and command circuit 14, the DQ circuit 15, the potential generator 16, and the SA/WD circuit 18.

The potential generator 16 receives a power potential from outside the memory device 1, such as from the memory controller 2, and generates various potentials for operations of the memory device 1 in accordance with the control of the controller 13. The generated potentials are supplied to components, such as the row decoder 19 and the SA/WD circuit 18.

The address and command circuit 14 receives a signal CA from the memory controller 2. The signal CA has a width of multiple bits and includes commands and an address signal. The address and command circuit 14 distinguishes the commands and the address signal in accordance with the control of the controller 13 with the signals CS and CKE. The address and command circuit 14 transmits the address signal and/or the commands to the row decoder 19 and the column decoder 17.

The row decoder 19 is coupled to the word lines WL, and transfers the potentials from the potential generator 16 to a word line WL specified by the address signal received from the address and command circuit 14 to select a specified word line WL.

The column decoder 17 is coupled to the bit lines BL and /BL, selects a bit line pair specified by the address signal received from the address and command circuit 14.

The SA/WD circuit 18 includes multiple sense amplifier circuits SAC (not shown). Each sense amplifier circuit SAC is coupled to one bit line BL during a read of data, and uses a cell current flowing through the bit line BL via a read-target memory cell MC to determine the data stored in the read-target memory cell MC. The SA/WD circuit 18 further includes a write circuit. The write circuit applies a voltage to a write-target memory cell MC via a pair of bit lines BL and /BL to write data in the write-target memory cell MC.

The DQ circuit 15 receives a signal DQ from the memory controller 2. The signal DQ has a width of multiple bits and is data, such as read data and write data. The DQ circuit 15 receives read data read from the memory cells MC to the SA/WD circuit 18, and transmits the received read data to the memory controller 2 as the signal DQ. The DQ circuit 15 also receives write data from the memory controller 2 as the signal DQ, and transmits the received write data to the SA/WD circuit 18.

FIG. 2 illustrates components and connections of a part of the memory device 1 of the first embodiment. Specifically, FIG. 2 illustrates respective parts of the memory cell array 11, the reference cell array 12, and the SA/WD circuit 18, read-related components of these functional blocks, and illustrates one state during a read. FIG. 2 illustrates one sense amplifier circuit SAC and components associated with that sense amplifier circuit SAC. A sense amplifier circuit SAC serves for determination of data of associated memory cells MC, and is provided with a reference resistance circuit 27. The memory device 1 includes the same multiple structures as that in FIG. 2.

As illustrated in FIG. 2, during a read, a sense amplifier circuit SAC is coupled at its non-inverting input to one bit line BL via one or more transistors, such as an n-type metal oxide semiconductor field effect transistor (MOSFET) 28, and at its inverting input to one interconnect BLref via one or more transistors, such as an n-type MOSFET 29. During a read, one bit line BL is coupled to one memory cell MC and is uncoupled from other unselected memory cells MC. The sense amplifier circuit SAC determines data stored in the memory cell MC coupled to that sense amplifier circuit SAC based on whether the potential on the bit line BL coupled to that sense amplifier circuit SAC is higher or lower than the potential on the interconnect BLref.

A memory cell MC is coupled to a pair of bit lines BL and /BL, and includes an MTJ element 21 and a select transistor 22. The MTJ element 21 is coupled to the bit line BL and a first end of the select transistor 22. The select transistor 22 is coupled at its second end to the bit line /BL, and at its gate to one word line WL. During a read, the potential of the word line WL is made high, which electrically couples the MTJ element 21 between the bit line /BL and the non-inverting input of the sense amplifier circuit. SAC. The bit line /BL is coupled to a node of a potential VSS via an n-type MOSFET23, or is grounded. The transistor 23 receives a signal SINK from the controller 13 at its gate.

The interconnect BLref is coupled to the reference cell array 12. The reference cell array 12 includes an n-type MOSFET 26 and a reference resistance circuit 27. The transistor 26 is coupled at its first end to the interconnect BLref, at its gate to an interconnect WLref, and at its second end to a first end of the reference resistance circuit 27. The reference resistance circuit 27 is grounded at its second end, has a resistance of magnitude between the first and second ends, and includes multiple reference cells RC, each of which includes one MTJ element 21r. The reference resistance circuit 27 is described in detail below. During a read, the potential of the interconnect WLref is made high, which electrically couples the reference resistance circuit 27 between the inverting input of the sense amplifier circuit SAC and the ground.

FIG. 3 illustrates a structure of the MTJ element 21 of the memory cell MC and the MTJ element 21r of the reference cell RC, and illustrates layers included in the MTJ elements 21 and 21r. As illustrated in FIG. 3, the MTJ elements 21 and 21r include two ferromagnets SL and RL and a non-magnet TB between the ferromagnets SL and RL. The magnetization orientation of the ferromagnet RL is invariable in normal operations of the memory device 1, whereas the magnetization orientation of the ferromagnet SL is variable. The ferromagnets SL and RL have respective magnetization easy axes (illustrated by the arrow) along a direction which penetrates the interfaces of the ferromagnet SL, nonmagnet TB, and the ferromagnet RL. The ferromagnets SL and RL may also have magnetization easy axes along the interfaces of the ferromagnet SL, the nonmagnet TB, and the ferromagnet RL. The nonmagnet TB is an insulator, for example.

The MTJ elements 21 and 21r exhibit the minimum resistance when the magnetization orientations of the ferromagnets SL and RL are parallel. In contrast, the MTJ elements 21 and 21r exhibit the maximum resistance when the magnetization orientations of the ferromagnets SL and RL are antiparallel. The states exhibiting two different resistances can be assigned to binary data, respectively. A write current IwP flowing from the ferromagnet SL toward the ferromagnet RL makes the magnetization orientation of the ferromagnet SL parallel to the magnetization orientation of the ferromagnet RL. The MTJ element 21 with the magnetization orientation of the ferromagnet SL parallel to the magnetization orientation of the ferromagnet RL, or the MTJ element 21 in a P-state, is in the low resistance state, and has a resistance Rp.

In contrast, write current IwAP flowing from the ferromagnet RL toward the ferromagnet SL makes the magnetization orientation of the ferromagnet SL antiparallel to the magnetization orientation of the ferromagnet RL. The MTJ element 21 with the magnetization orientation of the ferromagnet SL antiparallel to the magnetization orientation of the ferromagnet RL, or the MTJ element in an AP-state, is in the high resistance state, and has a resistance Rap.

The MTJ element 21r is, however, more likely than the MTJ elements 21 to stabilize in either the P-state or the AP-state with no magnetic field applied. Specifically, the MTJ elements 21r stabilize in the P-state with more easiness than the easiness with which the MTJ elements 21 stabilize in the P-state, and stabilize in the P-state more strongly than the MTJ elements 21, for example. For this reason, the write current IwP for the MTJ elements 21r is different from the write current IwP for the MTJ elements 21.

Alternatively, the MTJ elements 21r stabilize in the AP-state with more easiness than the easiness with which the MTJ elements 21 stabilize in the AP-state, and stabilize in the AP-state more strongly than the MTJ elements 21. For this reason, the write current IwAP for the MTJ elements 21r is different from the write current IwAP for the MTJ elements 21.

The MTJ elements 21 are intended to have no inclination of stability in the AP or P-state; however, in actuality they may stabilize more easily in either state due to variation of their characteristics. The MTJ elements 21r have no such stabilization inclination produced unintentionally against desire for no inclination, but an intended inclination for the stability.

For a read of data, the current Ir is sent, for example from the ferromagnet RL to the ferromagnet SL, and the state of the resistance of the MTJ element 21 is determined.

The above description of magnetization orientation of the ferromagnet RL being "invariable" refers to that the magnetization orientation of the ferromagnet RL does not switch with a current of magnitude which may switch the magnetization orientation of the ferromagnet SL. The MTJ elements 21 and/or 21r may include an additional layer or layers.

In the following description, the ferromagnet SL, the nonmagnet TB, and the ferromagnet RL of the MTJ element 21r are referred to as a ferromagnet SLr, a nonmagnet TBr, and a ferromagnet RLr, respectively.

Figure 4:
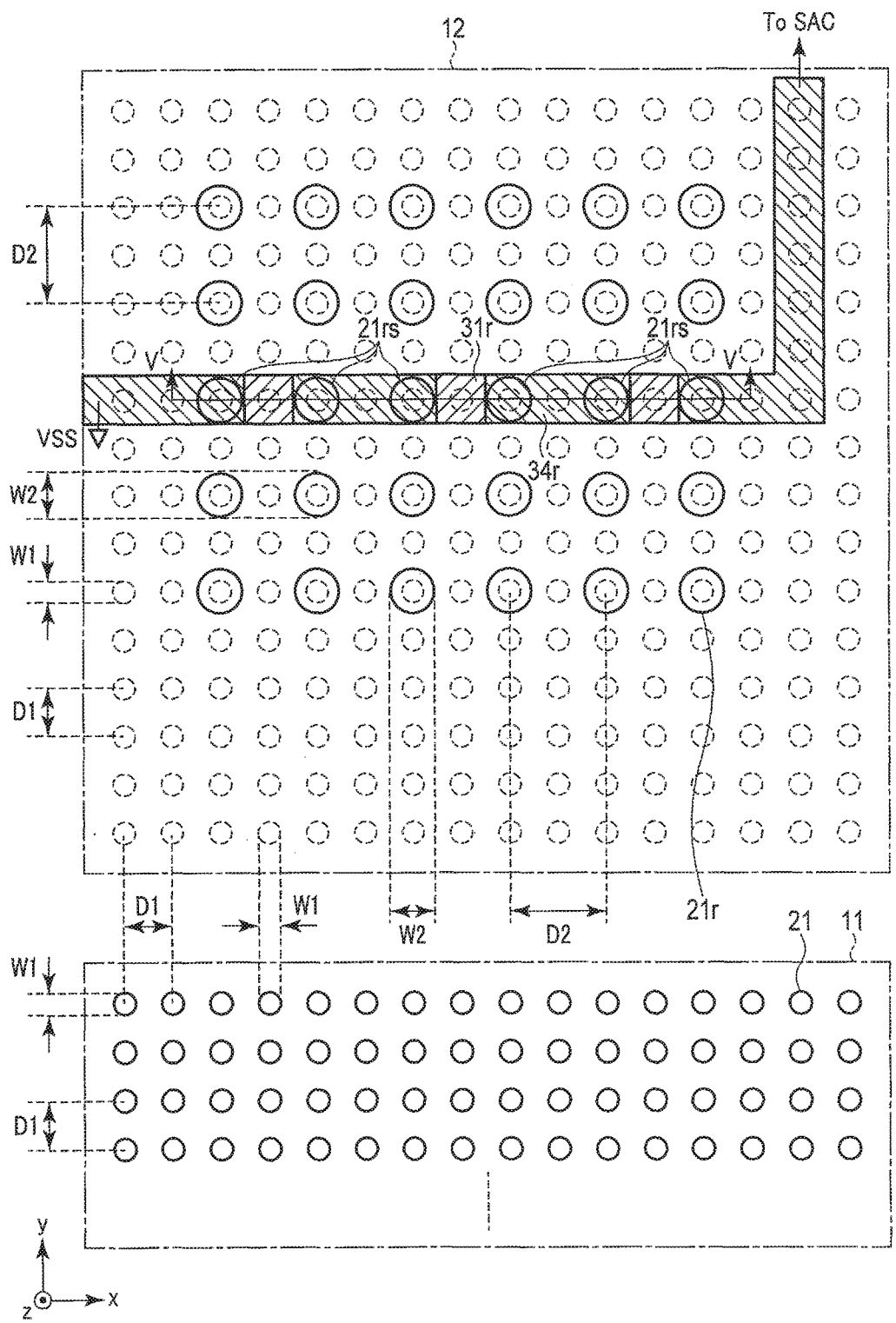
FIG. 4 illustrates plan views of parts of a memory cell array and a reference cell array of the first embodiment.
Figure 5:
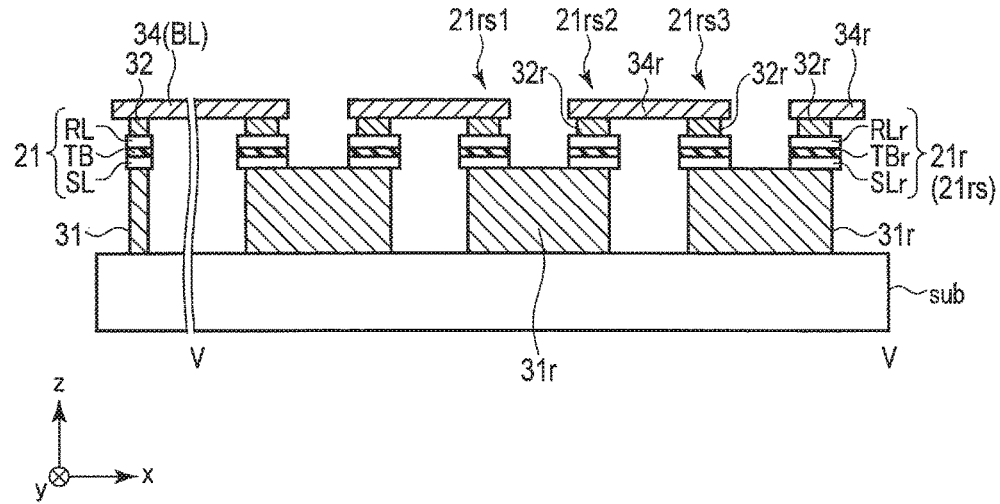
FIG. 5 illustrates a cross-sectional view of a part of the memory cell array and the reference cell array of the first embodiment.

FIG. 4 illustrates structures of parts of the memory cell array 11 and the reference cell array 12 of the first embodiment along the xy-plane, illustrates a structure of the reference resistance circuit 27, and illustrates a part associated with one sense amplifier circuit SAC. The xy-plane spreads along a surface of a substrate sub (not shown) on which the memory device 1 is formed. FIG. 5 illustrates the structure of a part of the memory cell array 11 and the reference cell array 12 of the first embodiment along the xz-plane, and illustrates the cross-sectional view along V-V line in FIG. 4.

As illustrated in FIGS. 4 and 5, the memory cell array 11 includes MTJ elements 21 arranged in a matrix. Each of the MTJ elements 21 has a shape of a substantial circle, and has a diameter of a length W1. The "substantial" circle used herein does not mean a perfect circle, but refers to an imperfect circle due to variation and imperfection of the manufacturing process although a circle is desired and/or expected. The MTJ elements 21 are lined up along the x and y-directions at equal intervals of a pitch of a length D1. The pitch is the distance between respective centers of two adjacent MTJ elements 21, for example.

The MTJ elements 21 may also be a substantial square. In this case, each MTJ element 21 has edges of the length W1.

The reference cell array 12 includes MTJ elements 21r arranged in a matrix. The MTJ elements 21 are also drawn in the reference cell array 12 by the dashed line with the same shape and arrangement as the MTJ elements 21 in the memory cell array 11 for purposes of reference and comparison.

Each of the MTJ elements 21r has a shape of a substantial circle, and has a diameter of a length W2. The MTJ elements 21r may also be a substantial square. In this case, each MTJ elements 21r has edges of the length W2.

The length (or, diameter) W2 is two to five times the length (or, diameter) W1. This results in the area of the MTJ element 21r along the xy-plane being four to twenty-five times the area of the MTJ element 21 along the xy-plane. FIG. 4 illustrates an example of the diameter W2 being twice the diameter W1.

Figure 6:
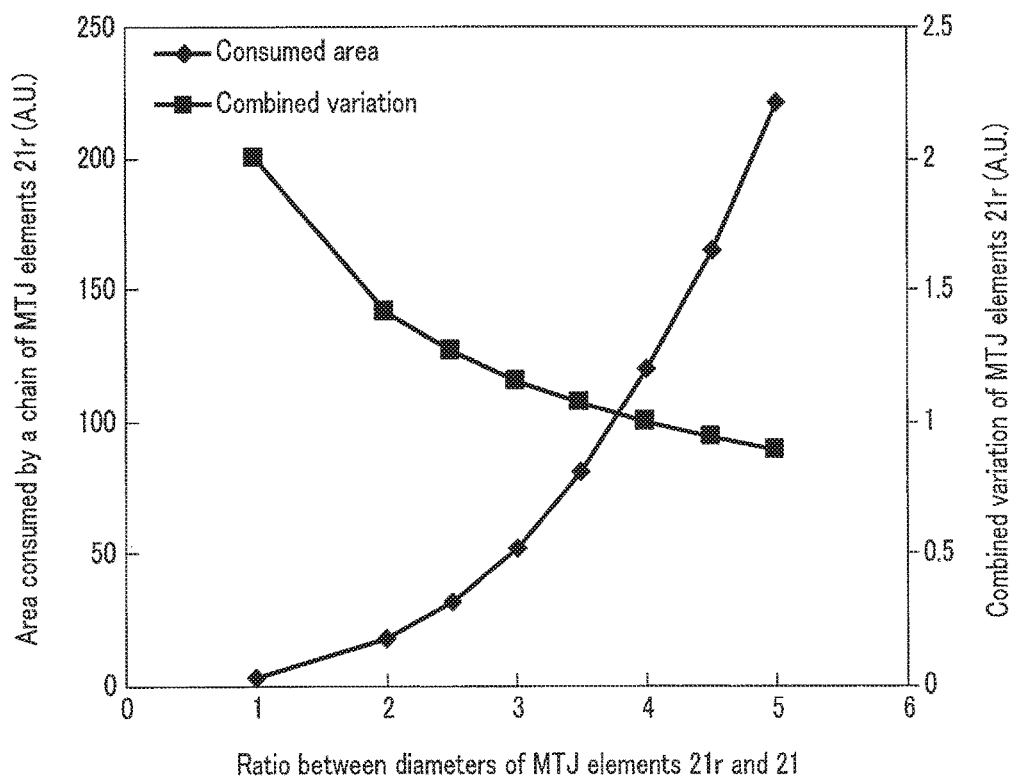
FIG. 6 illustrates relationships among diameters of MTJ elements for reference cells, a consumed area and combined variation of serially-coupled MTJ elements for reference cells of the first embodiment.

Reasons why the minimum ratio of the length W2 to the length W1 is two include the following ones. The MTJ elements 21r are intended to have a larger diameter than that of the MTJ elements 21 to have a lower resistance than that of the MTJ element 21 as will be described; but if the MTJ elements 21r are too small, this will result in an insufficient ratio of the resistance of the MTJ elements 21r to the resistance of the MTJ elements 21 and too large a granularity for adjustment of the resistance of the reference resistance circuit 27. On the other hand, the reason for the maximum ratio of the length W2 to the length W1 is five is to avoid too large an area of the reference cell array 12, whereas a large length W2 does not necessarily provide a to-be-described advantage of reduced variation of MTJ elements 21r so much. Specifically, based on an example, some MTJ elements 21r are electrically coupled in series as will be described, and the larger the ratio of the length (or diameter) W2 to the length W1 as illustrated in FIG. 6, the larger an area consumed by such a serially-coupled structure (or, a chain) of MTJ elements 21r geometrically. In contrast, the combined variation of the MTJ elements 21r is not so small even with a larger ratio of the length W2 to the length W1. Therefore, from the viewpoint of a balance among an acceptable area for the reference cell array 12, a necessary number of MTJ elements 21r, and reduction of the variation of the MTJ elements 21r, the length W2 is preferably smaller than or equal to three times the length W1, and more preferably smaller than or equal to twice the length W1, for example.

The MTJ elements 21r are lined up at equal intervals with a pitch of a length D2 along the x-direction and the y-direction. The pitch is the distance between respective centers of two adjacent MTJ elements 21r, for example. The length D2 (or, the pitch D2) is dependent on the diameter W2. As in the FIG. 4 example, when the diameter W2 is twice the diameter W1, the pitch D2 is twice the length D1 (or, pitch D1).

The MTJ elements 21 are located above a substrate sub. The ferromagnets SL are coupled at their bottoms to the tops of conductors 31. The bottoms of the conductors 31 are coupled to a top of the substrate sub. The ferromagnets RL are coupled at their tops to bottoms of conductors 32. The conductors 32 are coupled at their tops to bottoms of conductors 34. The conductors 34 serve as bit lines BL.

The MTJ elements 21r are also located above the substrate sub, and are located at the same level (or, in the same layer) as the MTJ elements 21. The ferromagnet SLr, the nonmagnet TBr, and the ferromagnet RLr are respectively located at the same levels (or, in the same layers) as the ferromagnets SL, the nonmagnets TB, and the ferromagnets RL, and respectively originate from the same materials as and can be formed in parallel through the same process as the ferromagnet SL, the nonmagnet TB, and the ferromagnet RL.

Among the MTJ elements 21r, some MTJ elements 21rs are coupled in series and serve as a part of the reference resistance circuit 27. FIG. 4 illustrates an example of six MTJ elements 21rs. The MTJ elements 21rs can be coupled in series by a structure described in the following. A structure is repeatedly provided for each set of three adjacent first MTJ element 21rs1, second MTJ element 21rs2, and third MTJ element 21rs3. The first and second MTJ elements 21rs1 and 21rs2 are electrically coupled to each other via a conductor 31r. The second and third MTJ elements 21rs2 and 21rs3 are electrically coupled to each other via conductors 32r and 34r. Details are as follows.

Respective bottoms of respective ferromagnets SLr of the first and second MTJ elements 21rs1 and 21rs2 are coupled to a top of one conductor 31r. The conductors 31r are located at the same level (or, in the same layer) as the conductors 31, and originate in the same material and can be formed in parallel through the same process as the conductors 31.

The ferromagnet RLr of the second MTJ element 21rs2 is coupled at its top to a conductor 32r, and the ferromagnet RLr of the third MTJ element 21rs3 is coupled at its top to another conductor 32r. The conductors 32r are located at the same height (or, in the same layer) as the conductors 32, and originate from the same material and can be formed in parallel through the same process as the conductors 32. A top of the conductor 32r of the second MTJ element 21rs2 and a top of the conductor 32r of the third MTJ element 21rs3 are coupled to a conductor 34r. The conductors 34r are located at the same height (or, in the same layer) as the conductors 34, and originate from the same material and can be formed in parallel through the same process as the conductors 34.

A set of MTJ elements 21rs electrically coupled series, or a reference MTJ element string, is coupled at the MTJ element 21rs at one end to the node of the potential VSS, and is electrically coupled at the MTJ element 21rs at the other end to the transistor 26 (see, FIG. 2).

FIG. 4 merely illustrates an example of electrically serially coupled MTJ elements 21rs, and any of the MTJ elements 21r can be electrically coupled to serve as an MTJ element 21rs.

Figure 7:
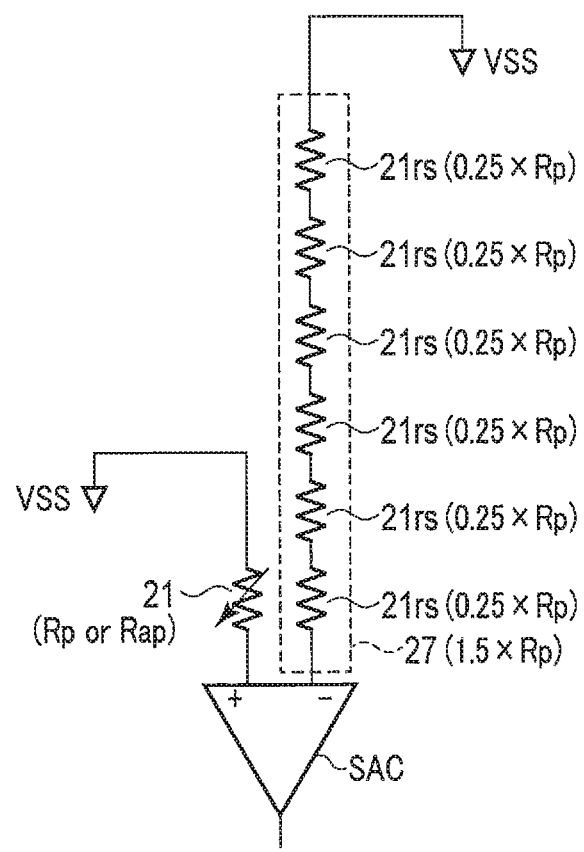
FIG. 7 illustrates an equivalent circuit of a part of the memory device of the first embodiment.

FIG. 7 illustrates an equivalent circuit of a part of the memory device 1 of the first embodiment, and illustrates an equivalent circuit of FIG. 2 in a case where the reference resistance circuit 27 includes six serially-coupled P-state MTJ elements 21rs each of which has an area four times the area of an MTJ element 21. Since each MTJ element 21rs has an area four times an MTJ element 21, it has a resistance of 0.25×Rp. Moreover, since six MTJ element 21rs are coupled in series, the reference resistance circuit 27 has a resistance of 1.5 Rp.

Figure 8:
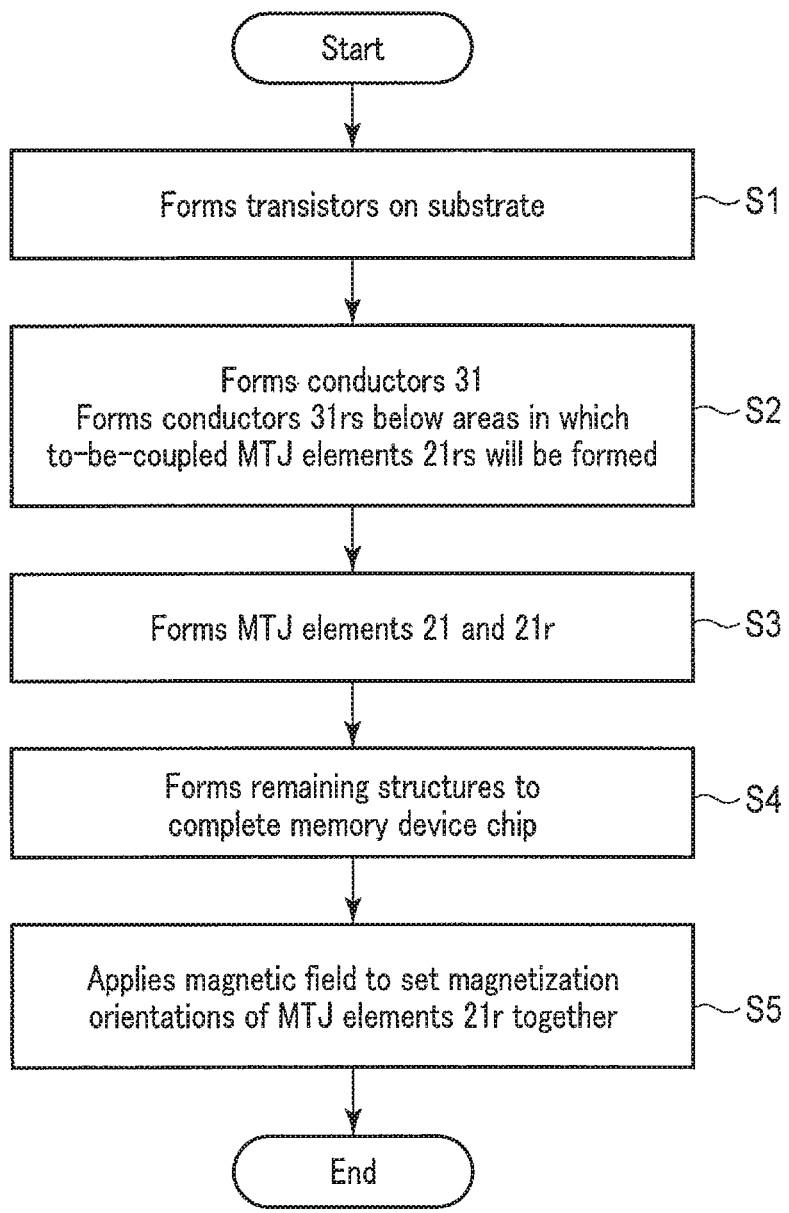
FIG. 8 illustrates the flow of manufacturing the memory device of the first embodiment.

FIG. 8 illustrates the flow of manufacturing the memory device 1 of the first embodiment, especially the reference resistance circuit 27, and in particular illustrates a flow up to the completion of a chip of the memory device 1. As illustrated in FIG. 8, transistors to partially make various functional blocks of the memory device 1 including the select transistors 22 are formed in an area in a surface of the substrate sub (step S1).

The conductors 31 and 31r are formed on the substrate sub (step S2). Each conductor 31r is provided below the area in which two MTJ elements 21rs to be electrically coupled will be formed. The MTJ elements 21rs to be electrically coupled can be determined from the shapes of the MTJ elements 21r, and by extension the resistances, in advance, or in a stage of designing the memory device 1. Based on this determination, the conductors 31r are formed below the areas in which MTJ elements 21rs to be coupled by the conductors 31r will be formed.

In step S3, the MTJ elements 21 and 21r are formed on the conductors 31 and the conductors 31r. In step S1, the MTJ elements 21r are all formed to stabilize in the same one of the AP and P-states more easily than the other. For example, the MTJ elements 21r are all formed to stabilize in the P-state more easily than the AP-state with no magnetic field applied to the MTJ elements 21r from outside the MTJ elements 21r (Hshift>0). The MTJ elements 21 are formed in an effort to bring about no inclination of stability to the AP or P-state.

In step S4, interconnects in a layer or layers above the MTJ elements 21 and 21r and pads, etc. are formed, and the chip of the memory device 1 is completed.

In step S5, a magnetic field is applied to the MTJ elements 21r from outside, and the MTJ elements 21r are set to be in the AP or P-state (for example, P-state) together. As described above, the MTJ elements 21r are all formed to easily stabilize in a selected one of the AP and P-states, or they all satisfy Hshift>0, for example. The manufactured MTJ elements 21r, however, may not have the intended magnetic properties due to variation in the process, for example. In light of this, the magnetic properties of the MTJ elements 21r (for example, Hshift) may be actually measured and then the MTJ elements 21r may be set in the AP or P-state together in step S5.

<1-2. Advantages>

According to the first embodiment, the MTJ elements 21r are used for the reference resistance circuit 27, which can implement the reference resistance circuit 27 with good temperature characteristics, a small area, and a small susceptibility to process variation. Details are as follows.

In general, a reference resistance can be implemented by an impurity diffusion area formed in a substrate. The diffusion area, however, tends to be large. Moreover, in general MTJ elements can take resistances of different magnitudes depending on the temperature, whereas the resistance of the impurity diffusion area does not depend on the temperature and therefore the reference resistance in turn does not depend on the temperature. For this reason, the difference between the reference resistance and the resistance (high or low resistance) of the MTJ element of a memory cell may differ due to the temperature, and therefore the reference resistance of the impurity diffusion area causes a read margin to vary due to the temperature variation. This leads to a low read margin of a memory device.

The reference resistance circuit 27 formed with the MTJ elements 21r as in the first embodiment allows the resistance of the reference resistance circuit 27 to depend on the temperature, and therefore the change of the resistances of the MTJ elements 21r due to the temperature follows the change of the resistances of the MTJ elements 21 due to the temperature. Therefore, substantially the same read margin can be realized at various different temperatures.

Moreover, the MTJ elements 21r have a size smaller than the impurity diffusion area for a reference resistance. The MTJ elements 21r originate from the same layers as the MTJ elements 21 and undergo the same process, and therefore unintended variation in parameters for the process of the MTJ elements 21 also equivalently occurs for the MTJ element 21*r*. This allows the variation in the characteristics of the MTJ elements 21*r* to follow the variation in the characteristics of the MTJ elements 21 due to the variation in various features (for example, shapes, thicknesses) in the processing of the MTJ elements 21. This can suppress the variation in the read margin which may result from the variation in the manufacturing process.

The memory device 1 of the first embodiment has a more stable read margin than in other cases with MTJ elements used for a reference resistance. Details are as follows.

In general, a reference resistance can be formed with MTJ elements formed similarly to MTJ elements included in the memory cells. This method can produce multiple advantages as described above; but it suffers from some disadvantages. The MTJ elements have minute shapes for highly dense arrangement of the memory cells. The resistances of minute MTJ elements are influenced more greatly by variations in process, size, and shape, etc. than larger MTJ elements. This is because the influence due to the variation in process, size, and shape of a particular common degree is larger for smaller MTJ elements than larger MTJ elements. This causes a memory device with smaller memory cells to exhibit a larger variation in value of a reference resistance.

Moreover, a reference resistance is intended to be a substantial median between the resistance of the low resistance state MTJ element of a memory cell and the resistance of the high resistance state MTJ element of the memory cell. To this end, a combined resistance of some low resistance state MTJ elements for the reference resistance and some high resistance state MTJ elements for the reference resistance is used. It is ideal if MTJ elements for reference maintain the high or low resistance state over an infinite time. In actuality, however, the MTJ elements have a limited retention characteristic (characteristic of maintaining a resistance state), and therefore they may be unable to maintain the low or high resistance state due to read disturbs caused by current flowing during reads. Under such a circumstance, MTJ elements for reference may be reset (or, rewritten in) into the intended resistance state to avoid the resistance state from being switched while a memory device is being used, for example. Such a use leads to concerns of decrement of the endurances of the MTJ elements for reference. Note that the MTJ elements for reference can have a high retention characteristic as a measure against the read disturbs; however, to compensate, an increased current is necessary for a write of the MTJ elements for reference, which causes concerns of further decrement in endurance.

The reference resistance circuit 27 of the first embodiment includes the MTJ elements 21*r* of larger areas than those of the MTJ elements 21. For this reason, the resistances of the MTJ elements 21*r* are influenced less than the MTJ elements 21 due to the variation of the same process, dimensions, and shape. Moreover, the MTJ elements 21*r* have retention characteristics higher than the MTJ elements 21. This is because the coercivity of a ferromagnet is proportional to the volume of the ferromagnet. Since the MTJ elements 21*r* have retention characteristics higher than would be in a case where they have the same areas as the MTJ elements 21, the reference resistance circuit 27 can remain in the same resistance state more stably.

Moreover, the reference resistance circuit 27 includes a serial coupling structure (or, a chain) of the MTJ elements 21*r* each of which has a resistance smaller than the MTJ elements 21. Since the resistance of each MTJ element 21*r* is small, the combined resistance of the MTJ elements 21*r* can be adjusted in a small unit through increment or decrement of the number of serially-coupled MTJ elements 21*r*. This allows a desired reference resistance to be easily realized.

Furthermore, the MTJ elements 21*r* are formed to easily stabilize in either of the AP or P-state, whereas the MTJ elements 21 are prevented from easily stabilizing in either the AS or P-state. This allows the MTJ elements 21*r* to remain in a selected one of the resistance states stably with no external magnetic field. Therefore, the switching of the magnetization state by read disturbs is hard to occur. This can reduce the necessity of resetting the magnetization state of the MTJ elements 21*r* to the intended one while the memory device 1 is being used, and can suppress the decrement in the endurance of the MTJ elements 21*r*.

<1-3. Modification>

Figure 9:
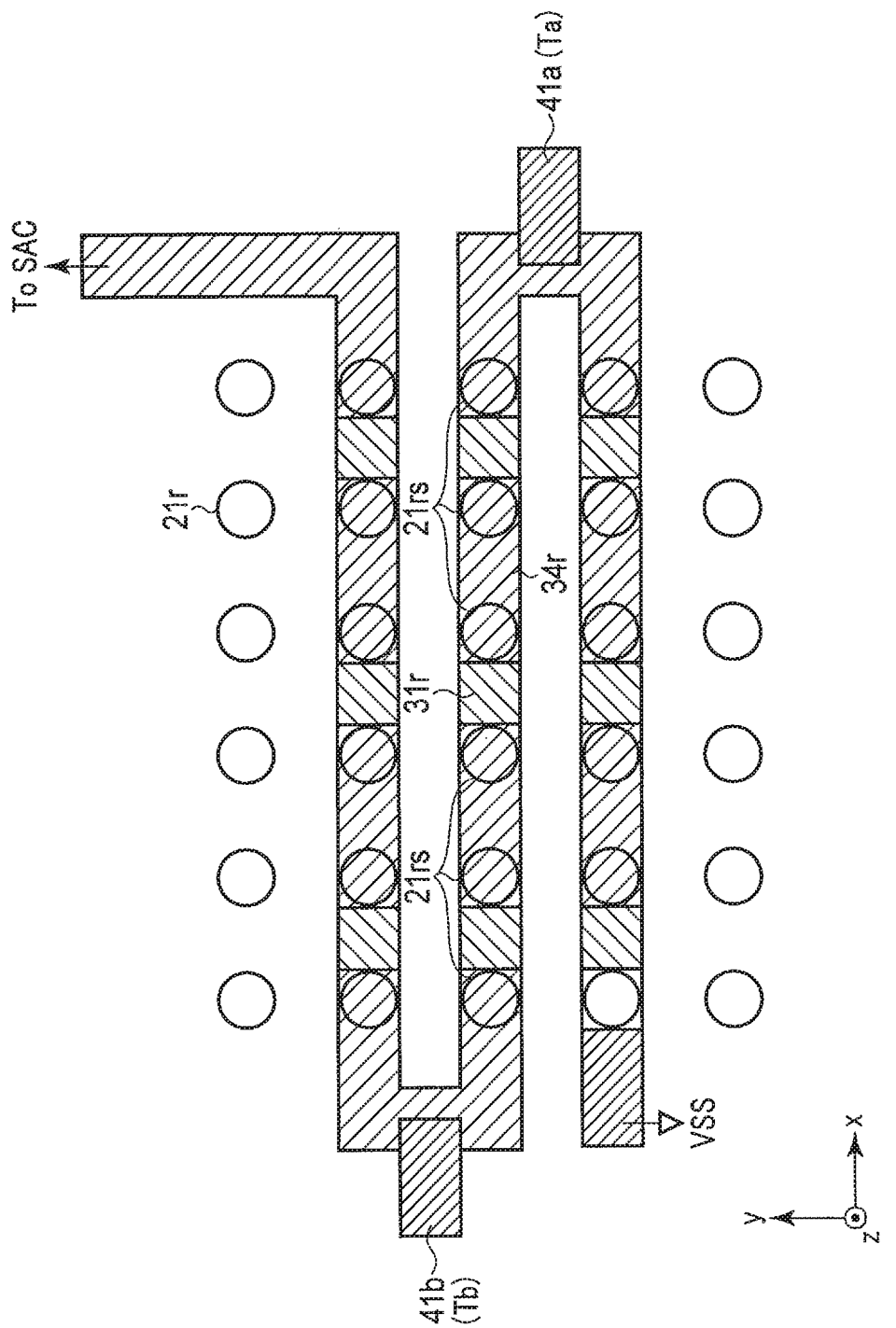
FIG. 9 illustrates a plan view of a part of a reference cell array of a modification of the first embodiment.

FIG. 9 illustrates a plan view of a part of a reference cell array 12 of the modification of the first embodiment as FIG. 4. As illustrated in FIG. 9, a reference MTJ element string includes more MTJ elements 21*rs* (eighteen, in the FIG. 9 example) than the FIG. 4 example.

A conductor 41*a* is provided on a conductor 34*r* which couples a certain set of two adjacent MTJ elements 21*rs*. The conductor 41*a* serves as a node Ta. A conductor 41*b* is provided on a conductor 34*r* which couples another set of two adjacent MTJ elements 21*rs*. The conductor 41*b* serves as a node Tb.

The node Ta is closer to the node of the potential VSS than the node Tb in the reference MTJ element string. Therefore, the path from the node of the potential VSS to a sense amplifier circuit SAC has the highest resistance, the path from the node 41*a* to the sense amplifier circuit SAC has the second highest resistance, and the path from the node 41*b* to the sense amplifier circuit SAC has the lowest resistance. The reference MTJ element string may also be provided with more nodes through provision of additional conductors 41.

FIG. 10 illustrates components and connections of part of the memory device 1 of the modification of the first embodiment. The memory device 1 further includes a ROM fuse circuit 51. The ROM fuse circuit 51 is included in the SA/WD circuit 18, for example. The ROM fuse circuit 51 has a node N1 coupled to the node of the potential VSS, multiple nodes N2, and multiple nodes N3. Each node N2 is coupled to one of respective nodes Ta (Ta0, Ta1, . . . , Tan) (n being a natural number) of multiple reference MTJ element strings. Each node N3 is coupled to one of respective nodes Tb (Tb0, Tb1, . . . , Tbn) of multiple reference MTJ element strings.

The ROM fuse circuit 51 can electrically and exclusively couple one of the set of multiple (for example, all) nodes N2 and the set of multiple (for example, all) nodes N3 to the node N1. The coupling of the set of the nodes N2 or the set of the nodes N3 to the node N1 can be implemented by any methods, and can be implemented by a method such that the coupling cannot be basically changed once the coupling is made. Specific examples for realizing this include the following forms.

The ROM fuse circuit 51 includes components which control couplings. Such components include fuses which can be physically cut, for example. With a change of the state of the components which control the couplings (for example, cutting of a fuse), the ROM fuse circuit 51 maintains coupling between components which are desired to be coupled (for example, one node N3 and the node N1) and electrically uncouples components which are not desired to be coupled (for example, one node N2 and the node N1).

FIG. 11 illustrates a state where the nodes N3 are coupled to the node of the potential VSS, in FIG. 10 by way of example.

Extension of a principle described so far allows the ROM fuse circuit 51 to accommodate a case where more nodes are provided with corresponding conductors 41 in the reference MTJ element string to have a configuration which can couple one of multiple sets of nodes to the node N1 exclusively.

Figure 12:
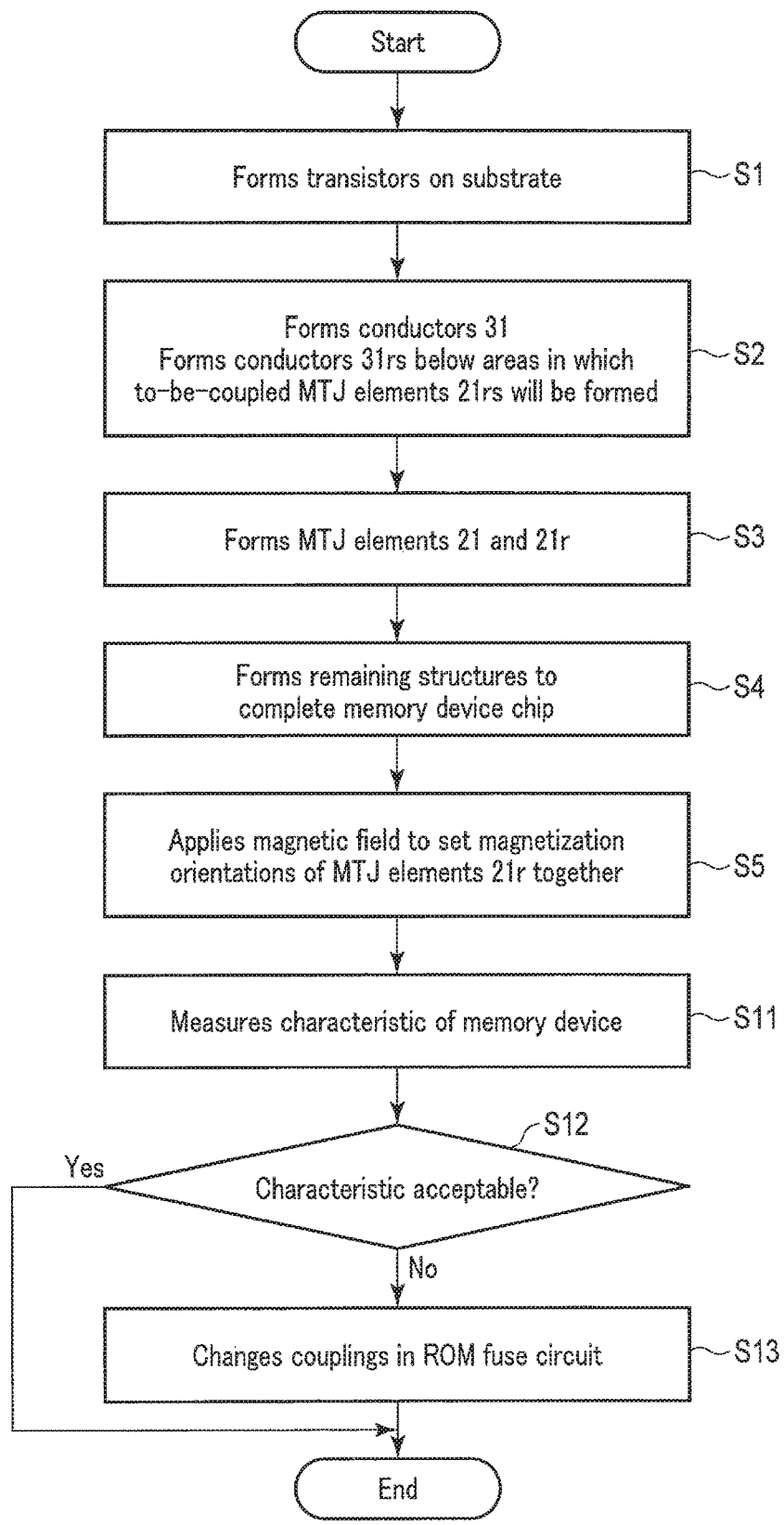
FIG. 12 illustrates the flow of manufacturing the memory device of the modification of the first embodiment.

FIG. 12 illustrates a flow of manufacturing the memory device 1 of the modification of the first embodiment, especially the reference resistance circuit 27, and in particular illustrates a flow up to the completion of a chip of the memory device 1. As illustrated in FIG. 12, the flow includes steps S1 to S5 illustrated in FIG. 8. Step S5 continues at step S11. In step S11, a characteristic of the memory device 1 is measured. For example, characteristics of data reads such as read margins are measured in step S11. Characteristics of an actually manufactured memory device 1 may not be as designed due to variation in features, such as conditions in a manufacturing process.

In step S12, it is determined whether the measured characteristic is acceptable. With an acceptable characteristic (Yes branch of step S12), the flow ends. With an unacceptable characteristic (No branch of step S12), the flow goes to step S13.

The characteristic may be improved by changing the resistance of the reference resistance circuit 27, which is the case for the modified embodiment. For this reason, in step S13, couplings of components in the ROM fuse circuit 51 are changed to allow the resistance of the reference resistance circuit 27 to make the characteristic of the memory device 1 fall within an acceptable range.

The modification can also produce the same advantages as the first embodiment. Moreover, the modification allows the reference resistance circuit 27 to have a selected one of multiple resistances. For this reason, for example when a characteristic of the memory device 1 is found to be out of an acceptable range, the resistance of the reference resistance circuit 27 can be adjusted after completion of the chip of the memory device 1 to make the characteristic of the memory device 1 fail within the acceptable range. In addition, a structure for an adjustable resistance of the reference resistance circuit 27 can be implemented merely by expansion of serially-coupled MTJ elements 21r of the first embodiment and addition of components for the coupling (for example, a conductor from the conductor 41 to the node VSS).

Second Embodiment

The second embodiment differs from the first embodiment in the details of the reference resistance circuit 27, and relates to a variation of the reference resistance circuit 27.

Figure 13:
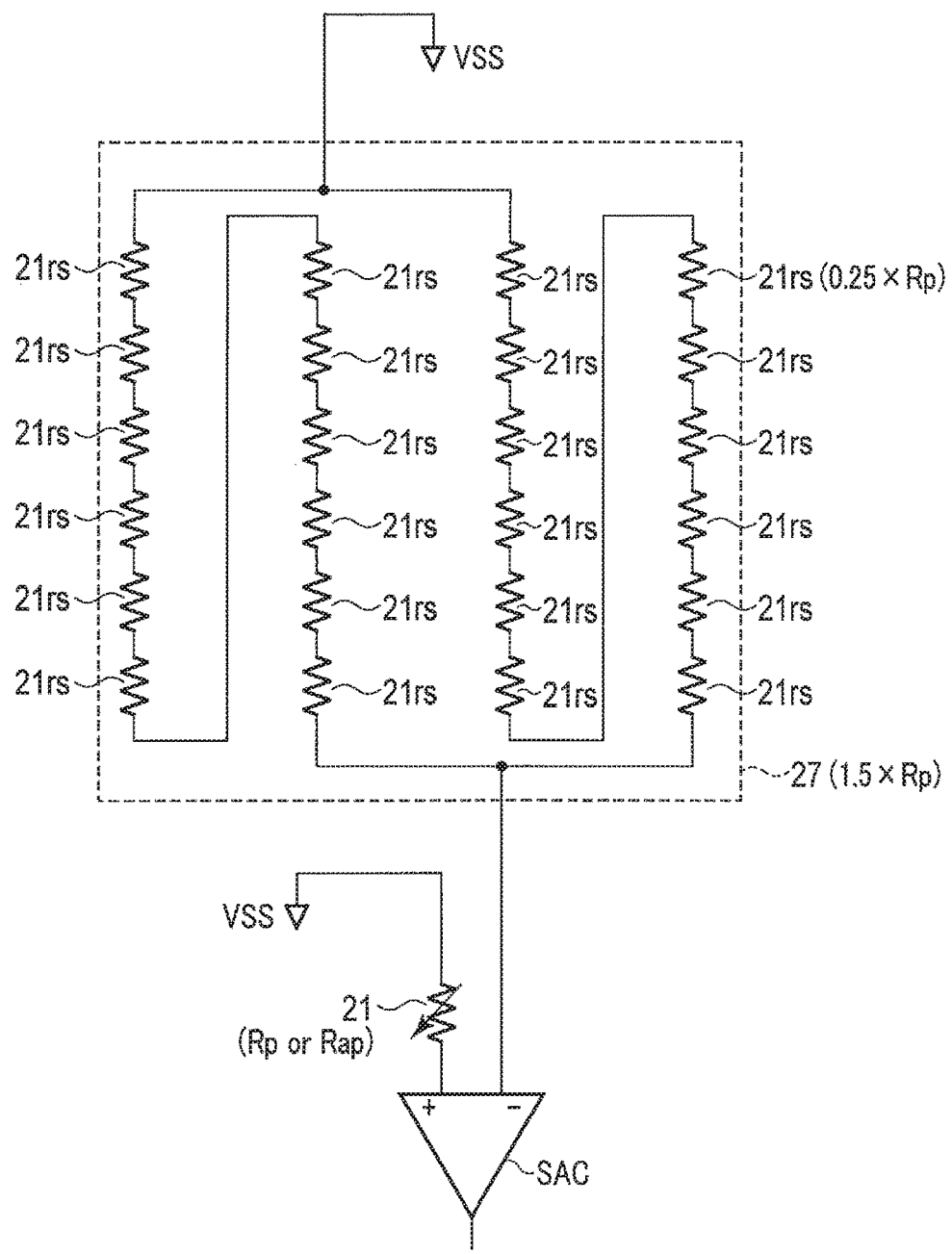
FIG. 13 illustrates an equivalent circuit of a part of a memory device of a second embodiment.

FIG. 13 illustrates an equivalent circuit of a part of the memory device of the second embodiment, and illustrates an equivalent circuit of FIG. 2 in a case where the reference resistance circuit 27 includes P-state MTJ elements 21rs each of which has an area four times the area of an MTJ element 21. The MTJ elements 21rs can be coupled differently from the serial coupling in the first embodiment. In order for the reference resistance circuit 27 to have the resistance of 1.5 Rp as in the first embodiment, the reference resistance circuit 27 has two sets of serially-coupled MTJ element 21rs, or serial coupling structures. The two serial coupling structures are coupled in parallel between the inverting input of the sense amplifier circuit SAC and the node of the potential VSS. Each serial coupling structure is formed of twelve P-state MTJ elements 21rs each of which has an area four times the area of an MTJ element 21. With the couplings illustrated in FIG. 13, the reference resistance circuit 27 has the resistance of 1.5 Rp. An example of the structure for realization of the FIG. 13 coupling is illustrated in FIG. 14.

Figure 14:
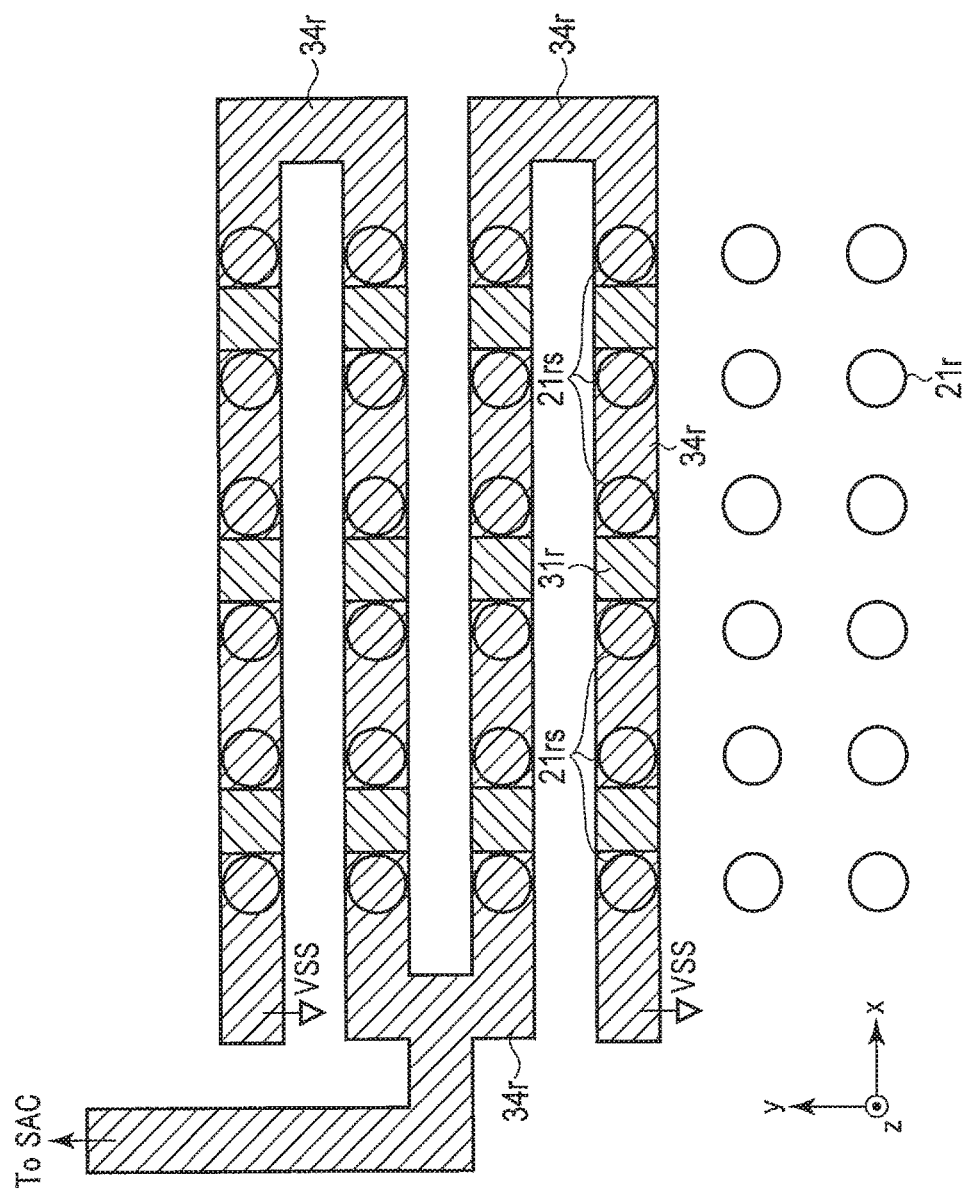
FIG. 14 illustrates a plan view of a part of a reference cell array of the second embodiment.

FIG. 14 illustrates a structure of a part of the reference cell array 12 of the second embodiment along the xy-plane, illustrates a structure of the reference resistance circuit 27, and illustrates a part associated with one sense amplifier circuit SAC.

As illustrated in FIG. 14, six MTJ elements 21rs lined up along the x-axis are electrically coupled in series, and four sets of such six electrically serially-coupled MTJ elements 21rs (serial coupling structures) are provided. The four serial coupling structures are electrically coupled in series. Specifically, the two serial coupling structures first and second from the top are coupled at their right ends to one conductor 34r, the two serial coupling structures second and third from the top are coupled at their left ends to one conductor 34r, and the two serial coupling structures third and fourth from the top are coupled at their right ends to one conductor 34r. In this way, a structure of electrically serially-coupled twenty-four MTJ elements 21rs is formed. The serial coupling structure of twenty-four MTJ elements 21rs is electrically coupled at its both ends to the node of the potential VSS, and electrically coupled to the inverting input of the sense amplifier circuit SAC at the conductor 34r which couples the left ends of the two serial coupling structure second and third from the top.

The structures (or, arrangement) of FIGS. 13 and 14 are mere examples. Multiple MTJ elements 21rs can be coupled in series and/or in parallel to allow the reference resistance circuit 27 to have a desired resistance.

The modification of the first embodiment is applicable to the second embodiment.

According to the second embodiment, the reference resistance circuit 27 includes serially or parallel-coupled MTJ elements 21rs each having a larger area than an MTJ element 21 and easy to stabilize in the AP or P-state, as in the first embodiment. This can produce the same advantages as the first embodiment.

Third Embodiment

The third embodiment differs from the first embodiment in the shapes and manufacturing of the MTJ elements 21r.

FIG. 15 illustrates a structure of a part of the reference cell array 12 of the third embodiment along the xy-plane, illustrates a structure of the reference resistance circuit 27, and illustrates a part associated with one sense amplifier circuit SAC. FIG. 15 also illustrates the MTJ elements 21 in the reference cell array 12 by the dashed line with the same shape and arrangement as the MTJ elements 21 in the memory cell array 11 for purposes of reference and comparison.

As illustrated in FIG. 15, the reference cell array 12 includes multiple MTJ elements 61r. Each of the MTJ elements 61r has a shape of a rectangle. The rectangle extends along the x-axis. The longer edge of the rectangular has a length W3 and the shorter edge has a length W4. The lengths W3 and W4 are based on a resistance which the MTJ element 61r is intended to have. For example, for a case where each MTJ element 61r has a twelfth of the resistance of an MTJ element 21, each MTJ element 61r is formed to have an area twelve times an MTJ element 21, and the lengths W3 and W4 are determined to allow the MTJ element 61*r* to have such an area. The MTJ elements 61*r* are lined up along the x-axis at an interval, and also lined up along the y-axis at an interval.

Among the MTJ elements 61*r*, some MTJ elements 61*rs* are coupled in series to serve as a part of the reference resistance circuit 27. The two of each pair of MTJ elements 61*rs* adjacent along the x-axis are electrically coupled by a conductor 31*r*. The two of each pair of MTJ elements 61*rs* adjacent along the y-axis are electrically coupled by a conductor 34*r*. Such couplings form a reference MTJ element string including twelve MTJ elements 61*rs*. One end of the reference MTJ element string is coupled to the node of the potential VSS, and the other end of the reference MTJ element string is coupled to the inverting input of the corresponding sense amplifier circuit SAC.

Figure 16:
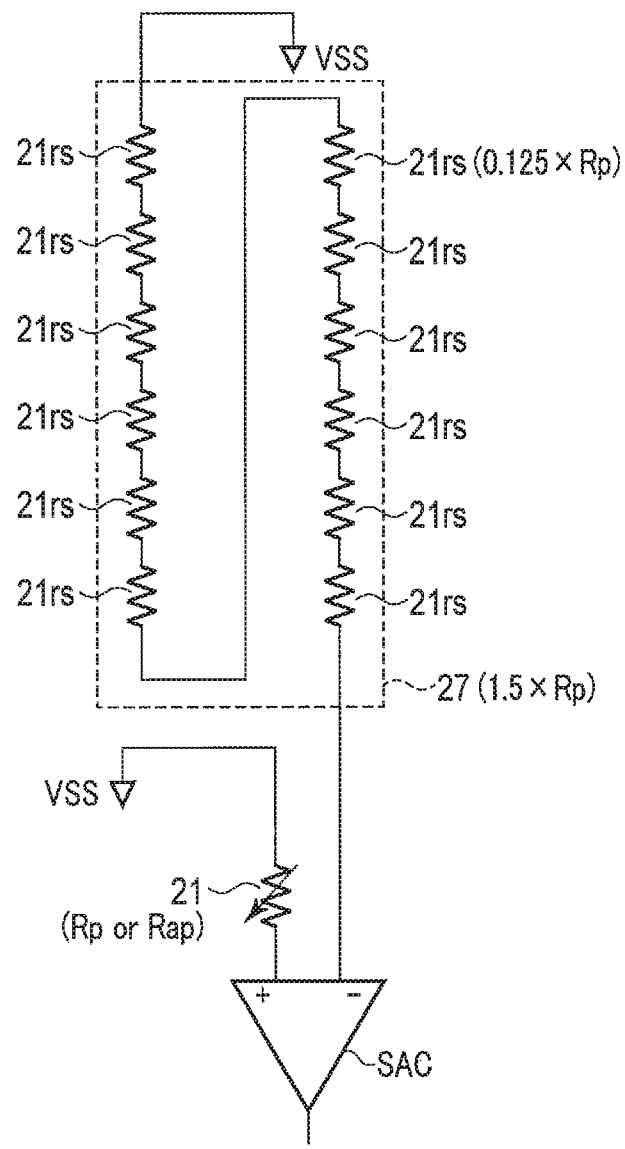
FIG. 16 illustrates an equivalent circuit of a part of the memory device of the third embodiment.

FIG. 16 illustrates an equivalent circuit of a part of the memory device 1 of the third embodiment, and illustrates an equivalent circuit of FIG. 15 in a case where the reference resistance circuit 27 includes twelve serially-coupled P-state MTJ elements 61*rs* each of which has an area twelve times the area of an MTJ element 21. The reference resistance circuit 27 has a resistance of 1.5 Rp.

The MTJ elements 61*rs* of the third embodiment can be formed, for example by the LELE process. The LELE process is known by persons skilled in the art, and includes two sets of a lithography process and the subsequent etching. The first set of the lithography process and etching forms a line and space pattern which includes lines and spaces therebetween extending along the x-axis, which forms the shorter edges (edges extending along the y-axis) of the MTJ elements 61*r*. Specifically, a mask of the line and space pattern is formed through a lithography process on a stack of layers for the MTJ elements 61*r* spreading along the xy-plane. This mask is then used to etch the stack of layers. Similarly, the second set of the lithography process and etching forms the longer edges (edges extending along x-axis) of the MTJ elements 61*r*. Such an LELE process can perform patterning finer and more accurately than patterning of layers with one set of a lithography process and etching.

Figure 17:
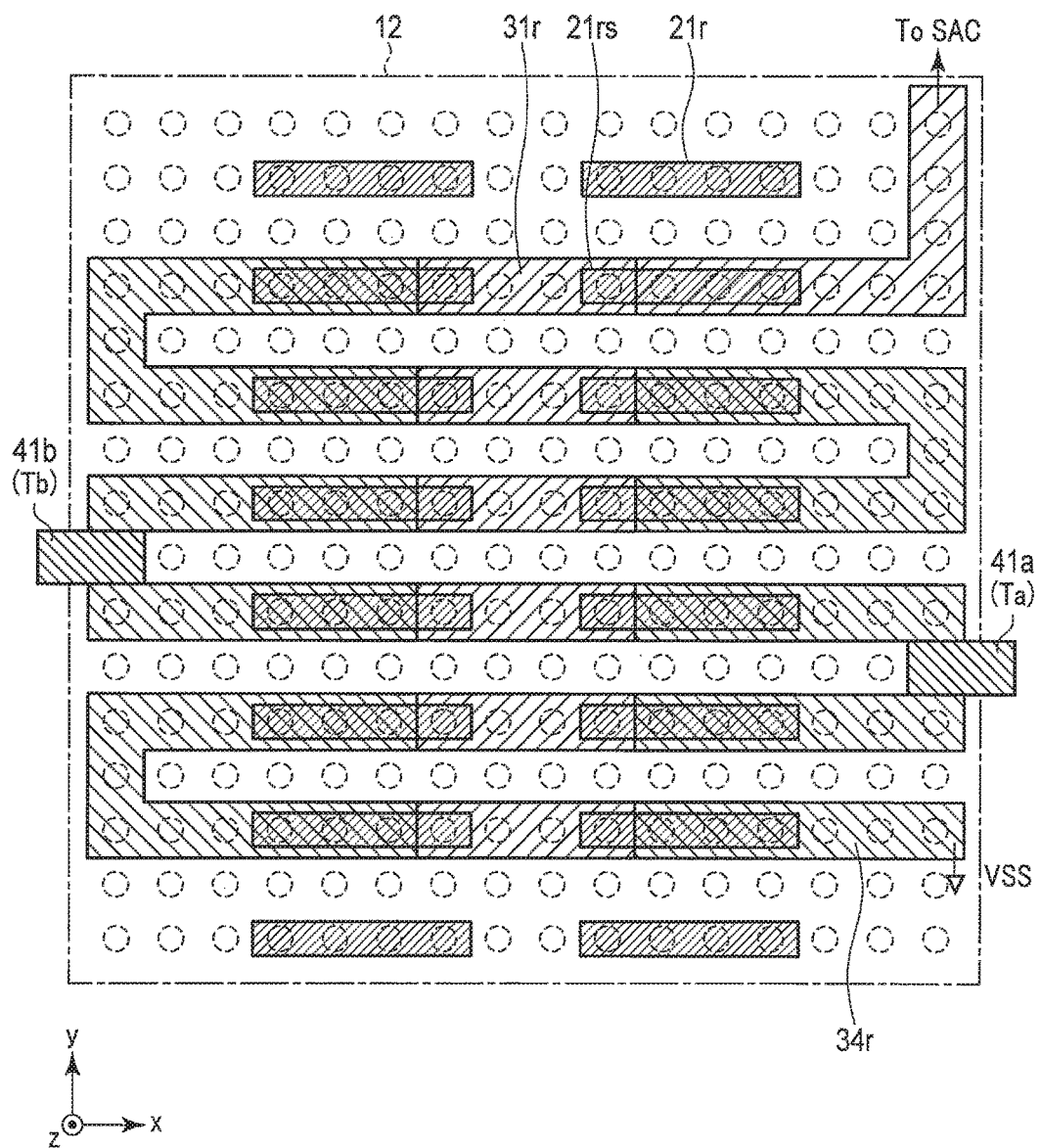
FIG. 17 illustrates a part of a reference cell array of a modification of the third embodiment.

This modification of the first embodiment is applicable to the third embodiment. FIG. 17 illustrates such an example and illustrates a plan view of a part of the reference cell array of the modified third embodiment. As illustrated in FIG. 17 and similarly in the modification of the first embodiment (FIG. 9), some conductors 34*r* are coupled to conductors 41*a* or 41*b*.

According to the third embodiment, the reference resistance circuit 27 includes serially or parallel-coupled MTJ elements 61*rs* each having a larger area than an MTJ element 21 and easy to stabilize in the AP or P-state, as in the first embodiment. This can produce the same advantages as the first embodiment.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A memory device comprising:
a first magnetic tunnel junction (MTJ) element having a first area along a first plane; and
second magnetic tunnel junction (MTJ) elements each having a second area along the first plane, the second area being larger than or equal to four times the first area and smaller than or equal to twenty-five times the first area,
wherein:
each of the second MTJ elements includes a first ferromagnet, a second ferromagnet, and a first nonmagnet between the first and second ferromagnets, respective magnetizations of respective first ferromagnets of the second MTJ elements being oriented along a first direction, and respective magnetizations of respective second ferromagnets of the second MTJ elements being oriented along a second direction,
the second MTJ elements are arranged in a matrix,
six or more of the second MTJ elements are coupled in series,
a first one of the six or more of the second MTJ elements that are coupled in series has a first end coupled to a sense amplifier,
a second one of the six or more of the second MTJ elements that are coupled in series has a second end coupled to a first potential,
a third one of the six or more of the second MTJ elements that are coupled in series has a third end coupled to the first potential, and
a fourth one of the six or more of the second MTJ elements that are coupled in series has a fourth end coupled to the third end and to the first potential.

2. The device according to claim 1, wherein:
the first MTJ element includes a third ferromagnet, a fourth ferromagnet, and a second nonmagnet between the third and fourth ferromagnets,
the first and third ferromagnets are located in a first layer,
the second and fourth ferromagnets are located in a second layer, and
the first and second nonmagnets are located in a third layer.

3. The device according to claim 2, wherein:
each of the second MTJ elements is switchable between a first state in which the first direction is parallel to the second direction and a second state in which the first direction is antiparallel to the second direction, and stabilizes in one of the first and second states more strongly than in the other of the first and second states with no magnetic field applied.

4. The device according to claim 1, wherein:
the first MTJ element is coupled at a first end to a first input of the sense amplifier, and
the first one of the second MTJ elements is coupled at the first end to a second input of the sense amplifier.

5. The device according to claim 1, wherein:
the first MTJ element is coupled at a first end to a first input of the sense amplifier,
the memory device further comprises a resistance circuit including the second MTJ elements, a first end, and a second end, and
the first end of the resistance circuit is coupled to a second input of the sense amplifier.

6. The device according to claim 3, wherein:
each of the second MTJ elements is coupled at its first ferromagnet to the first ferromagnet of another one of the second MTJ elements, or coupled at its second ferromagnet to the second ferromagnet of another one of the second MTJ elements, or coupled at its first ferromagnet to the first ferromagnet of another one of the second MTJ elements and coupled at its second ferromagnet to the second ferromagnet of still another one of the second MTJ elements.

7. The device according to claim 1, wherein:
the second MTJ elements include a first pair of second MTJ elements, and a second pair of second MTJ elements,
the second MTJ elements of the first pair are coupled to each other with a first conductor,
the second MTJ elements of the second pair are coupled to each other with a second conductor, and
the memory device further comprises a circuit which exclusively couples the first conductor or the second conductor to a first node.

8. The device according to claim 1, wherein:
each of the second MTJ elements has a shape of a substantial circle along the first plane.

9. The device according to claim 8, wherein:
each of the second MTJ elements has a diameter twice a diameter of the first MTJ element.

10. The device according to claim 8, wherein:
each of the second MTJ elements has a diameter twice a diameter of the first MTJ element,
the second MTJ elements include four sets of six second MTJ elements, and
the four sets of six second MTJ elements are coupled in parallel.

11. The device according to claim 8, wherein:
the memory device further comprises a third magnetic tunnel junction (MTJ) element,
each of the second MTJ elements has a diameter twice a diameter of the first MTJ element,
a pitch of the first and third MTJ elements has a first length,
a pitch of the second MTJ elements has a second length, and
the second length is twice the first length.

12. The device according to claim 1, wherein:
each of the second MTJ elements has a shape of a substantial rectangle along the first plane.

13. The device according to claim 12, wherein:
the rectangle includes a short edge and a long edge having a length four times a length of the short edge, and
the second MTJ elements comprise twelve second MTJ elements coupled in series.

14. The device according to claim 1, wherein:
each of the second MTJ elements has a first diameter that is larger than or equal to twice a second diameter of the first MTJ element and smaller than or equal to five times the second diameter,
the device further comprises a plurality of the first MTJ elements,
the plurality of the first MTJ elements are arranged in a matrix,
a pitch of the plurality of the first MTJ elements has a first length,
a pitch of the second MTJ elements has a second length, and
the second length is twice the first length.

15. The device according to claim 1, wherein:
the third end and the fourth end are coupled to the first potential through a fuse circuit.

16. The device according the claim 15, wherein:
a fifth one of the six or more of the second MTJ elements has a fifth end; and
a sixth one of the six or more of the second MTJ elements has a sixth end coupled to the fifth end and to the fuse circuit.

* * * * *